US 7,553,773 B2

(12) United States Patent
Hirose et al.

(10) Patent No.: US 7,553,773 B2
(45) Date of Patent: *Jun. 30, 2009

(54) PRESSURE CONTROL METHOD AND PROCESSING DEVICE

(75) Inventors: Eiji Hirose, Yamanashi (JP); Noriyuki Iwabuchi, Miyagi (JP); Takeshi Yokouchi, Miyagi (JP); Shingo Suzuki, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 610 days.

This patent is subject to a terminal disclaimer.

(21) Appl. No.: 11/102,709

(22) Filed: Apr. 11, 2005

(65) Prior Publication Data

US 2005/0176258 A1  Aug. 11, 2005

Related U.S. Application Data

(63) Continuation of application No. 10/149,678, filed on Jun. 13, 2002, now Pat. No. 6,908,864.

(30) Foreign Application Priority Data

Dec. 14, 1999  (JP)  ................................. 11-354372

(51) Int. Cl.
*H01L 21/302* (2006.01)
*H01L 21/461* (2006.01)
(52) U.S. Cl. ..................................... 438/714
(58) Field of Classification Search ............ 438/5, 438/14, 714; 216/58, 59; 156/345.26, 345.38; 118/722
See application file for complete search history.

(56) References Cited

U.S. PATENT DOCUMENTS

| 5,583,297 | A | 12/1996 | Stocker et al. |
| 6,022,483 | A | 2/2000 | Aral |
| 6,406,545 | B2 | 6/2002 | Shoda et al. |
| 6,635,580 | B1 | 10/2003 | Yang et al. |

FOREIGN PATENT DOCUMENTS

| JP | 58-109811 | | 6/1983 |
| JP | 02-148836 | | 6/1990 |
| JP | 05-102088 | * | 4/1993 |
| JP | 05-267224 | * | 10/1993 |
| JP | 08-227879 | | 9/1996 |

OTHER PUBLICATIONS

English Translation of International Preliminary Examination Report, Feb. 7, 2002.

* cited by examiner

*Primary Examiner*—Allan Olsen
(74) *Attorney, Agent, or Firm*—Finnegan, Henderson, Farabow, Garrett & Dunner, LLP

(57) ABSTRACT

First and second pressure sensors 132 and 134 that perform pressure detection over different pressure detection ranges from each other detect the pressure within a process chamber 102 of an etching device 100. A pressure controller 144 selects optimal pressure data in correspondence to the pressure inside the process chamber from the pressure data provided by the first and second pressure sensors 132 and 134. It also analyzes the selected pressure data at a resolution selected in correspondence to the pressure inside the process chamber 102 and thus obtains pressure data achieving a predetermined data density. The pressure controller 134 controls a pressure control valve 130 so as to ensure that the pressure data match preset pressure data.

14 Claims, 2 Drawing Sheets

PRESSURE CONTROL METHOD AND PROCESSING DEVICE

This is a continuation of application Ser. No. 10/149,678, filed Jun. 13, 2002 now U.S. Pat. No. 6,908,864, which is incorporated herein by reference.

TECHNICAL FIELD

The present invention relates to a pressure control method and a plasma processing device, and more specifically, it relates to a pressure control method adopted in a means for pressure control provided in a semiconductor manufacturing device.

BACKGROUND ART

A plasma processing device such as a plasma etching device, which is capable of performing various types of plasma processing, is utilized during a semiconductor device manufacturing process in the related art. Such a device processes a workpiece placed within a process chamber by generating plasma inside the process chamber with the pressure of its atmosphere sustained at a level lowered to a preset level. In addition, the pressure inside the process chamber is adjusted by controlling a pressure (evacuation quantity) control valve based upon pressure data provided by a pressure sensor.

As ultra high integration and super multi-layer structures are becoming increasingly common in semiconductor devices in recent years, a plurality of films constituted of different materials sometimes must be etched through continuous processing. During such processing, the pressure inside the process chamber may need to be raised/lowered in correspondence to the material constituting a given film. Some film materials require the processing to be executed at a low pressure of approximately several Pa. In addition, a pressure detection range over which detection is enabled is set for the pressure sensor and the pressure detection range of a pressure sensor capable of detecting a low pressure with a high degree of accuracy tends to be smaller under normal circumstances. For this reason, pressure data to be used in pressure control are sometimes obtained by switching among a plurality of pressure sensors as appropriate so as to detect the processing pressure levels at which the individual films are processed and to monitor the overall change in the pressure occurring inside the process chamber.

However, the processing device in the related art described above switches to a given pressure sensor among the individual pressure sensors based upon switching information that is set in advance. Namely, the pressure controller does not automatically switch among the various pressure sensors based upon the pressure data provided by the individual pressure sensors. As a result, it is difficult to obtain pressure data that reflect a drastic pressure change since the selection of the appropriate pressure sensor cannot be made promptly when the pressure inside the process chamber changes greatly. Thus, a problem arises in that the resulting delay in the control on the pressure inside the process chamber tends to cause inconsistency in the processing.

In addition, an increasing need to achieve super-miniaturization of semiconductor devices in recent years necessitates super-miniaturization processing to be implemented on a workpiece during an etching process, as well. When the workpiece undergoes the super-miniaturization processing, the pressure inside the process chamber must be rigorously adjusted to sustain the level of the pressure inside the process chamber at a predetermined level. Accordingly, accurate pressure control must be achieved through a finer analysis of pressure data provided by a pressure sensor. However, if the detected pressure is finely analyzed over a pressure range that does not affect the processing, too, the length of time required for the arithmetic processing increases. This may lead to a problem in that the response of the pressure control valve becomes poor.

An object of the present invention, which has been completed by addressing the problems of the related art discussed above, is to provide a new and improved pressure control method and a new and improved plasma processing device that provide a solution to problems identified above and other problems as well.

DISCLOSURE OF THE INVENTION

In order to achieve the object described above, in a first aspect of the present invention, a pressure control method, adopted in a means for pressure control that controls a means for pressure adjustment which adjusts the pressure inside a process chamber based upon pressure data provided by a means for pressure detection which detects the pressure inside the process chamber, with a plurality of means for pressure detection with different pressure detection ranges from one another connected in the process chamber and at least two of the means for pressure detection having pressure detection ranges overlapping each other, comprises a step in which the pressure data obtaining ranges over which pressure data are to be obtained are each set for one of a plurality of means for pressure detection with different pressure detection ranges from one another, a step in which pressure data selection values to be used to select pressure data to be utilized in pressure control from the pressure data provided by the individual means for pressure detection are set in correspondence to the individual pressure data obtaining ranges, a step in which the pressure data to be utilized in the pressure control are selected by comparing the pressure data provided by each means for pressure detection with the corresponding pressure data selection value and a step in which the means for pressure adjustment is controlled based upon the selected pressure data and preset pressure data corresponding to a preset pressure value.

In this method, optimal pressure data provided by the appropriate means for pressure detection corresponding to the pressure inside the process chamber can be obtained based upon the pressure data provided by the individual means for pressure detection. Thus, even though the plurality of means for pressure detection with varying pressure detection ranges are employed, the required pressure data can be obtained quickly. As a result, a level of control performance comparable to that achieved by using a single means for pressure detection is assured even when the plurality of means for pressure detection are employed.

It is desirable that the pressure data obtaining ranges be set so as to allow the pressure detection ranges of the individual means for pressure detection to overlap each other while ensuring that the pressure data provided by the means for pressure detection achieving a higher degree of pressure detection accuracy are selected from the pressure data provided by the plurality of means for pressure detection. In such a case, it becomes possible to obtain the pressure data provided by the means for pressure detection achieving a high degree of pressure detection accuracy within a range in which the pressure detection ranges of the individual means for pressure detection overlap each other. Since the pressure control can be implemented by using the optimal pressure data as a result, a further improvement is achieved with regard to the pressure control performance.

It is desirable that the means for pressure adjustment be controlled so as to ensure that the data value indicated by the selected pressure data conforms to the data value indicated by the preset pressure data. Since this achieves control of the means for pressure adjustment whereby the pressure inside the process chamber is set substantially equal to the preset pressure, the pressure inside the process chamber can be sustained at a level equal to the level of the pressure setting.

In addition, in a second aspect of the present invention, a pressure control method adopted in a means for pressure control that controls a means for pressure adjustment that adjusts the pressure inside a process chamber based upon pressure data provided by a means for pressure detection that detects the pressure inside the process chamber, comprises a step in which resolution application ranges corresponding to at least two resolutions with which pressure data are analyzed into a plurality of sets of data to virtually change the data density of the pressure data are set in correspondence to a pressure detection range of the means for pressure detection, a step in which a resolution selection value to be used to select a single resolution from the resolutions is set based upon the individual resolution application ranges, a step in which a single resolution is selected from the resolutions by comparing the pressure data with the resolution selection value, a step in which the data density of the pressure data is virtually changed at the selected resolution and a step in which the means for pressure adjustment is controlled based upon the pressure data having undergone the data density change and preset pressure data corresponding to a preset pressure value.

In this method, the pressure data obtained from a given means for pressure detection are analyzed at a specific resolution to change the data density of the pressure data to a predetermined data density. In addition, a different resolution can be set in correspondence to a specific range portion obtained by dividing the pressure detection range of the means for pressure detection. As a result, in a specific range that contains the preset pressure at which the processing is executed, for instance, accurate pressure information can be obtained by raising the resolution to achieve error-free pressure control.

It is desirable that the resolutions be set so as to increase the data density of the pressure data within a specific pressure range containing the preset pressure value. Since accurate pressure information can be obtained over the specific range containing the preset pressure value at which the processing is executed in this case, rigorous pressure control is realized.

In addition, it is desirable that the resolutions be set so as to increase the data density of the pressure data as the pressure level shifts from the atmospheric pressure level toward the preset pressure value. This allows the pressure detection accuracy to be virtually raised as the pressure inside the process chamber shifts from the atmospheric pressure toward the preset pressure value. As a result, rigorous pressure control is achieved during the processing and, at the same time, the arithmetic operation executed on the pressure data while the processing is not in progress can be simplified.

It is desirable that the means for pressure adjustment be controlled so that the data value indicated by the pressure data having undergone the change in the data density is made to conform to the data value indicated by the preset pressure data. By adopting such control, the pressure inside the process chamber can be sustained at the preset pressure level.

In a third aspect of the present invention, a pressure control method, adopted in a means for pressure control that controls a means for pressure adjustment that adjusts the pressure inside a process chamber based upon pressure data provided by a means for pressure detection that protects the pressure inside the process chamber, comprises a step in which pressure data obtaining ranges over which the pressure data are to be obtained are each set for one of a plurality of means for pressure detection with different pressure detection ranges from one another, a step in which pressure data selection values to be used to select pressure data to be utilized in pressure control from the pressure data provided by the individual means for pressure detection are set in correspondence to the individual pressure data obtaining ranges, a step in which resolution application ranges of at least two resolutions with which the pressure data are analyzed into a plurality of sets to virtually change the data density of the pressure data are set for each of the pressure data obtaining ranges, a step in which a resolution selection value to be used to select a single resolution from the resolutions corresponding to the selected pressure data is set based upon the individual resolution application ranges, a step in which the pressure data to be used in pressure control are selected by comparing the pressure data provided by each individual means for pressure detection with the corresponding pressure data selection value, a step in which a single resolution is selected from the resolutions by comparing the selected pressure data with the resolution selection value, a step in which the data density of the selected pressure data is virtually changed at the selected resolution and a step in which the means for pressure adjustment is controlled based upon the pressure data having undergone the data density change and preset pressure data corresponding to a preset pressure value.

In this method, based upon the pressure data, optimal data can be selected and obtained from the pressure data provided by the plurality of means for pressure detection. As a result, regardless of the number of means for pressure detection that are provided, control performance equivalent to the control performance achieved by using the pressure data from a single means for pressure detection is assured. Furthermore, the method allows a specific resolution to be set in correspondence to the pressure detection range of each means for pressure detection and also in correspondence to a specific segment of the range. Consequently, pressure control can be implemented by using the pressure data corresponding to the required degree of accuracy.

It is desirable that the resolutions be set so as to increase the data density of the pressure data within a specific pressure range containing the preset pressure value.

In addition, it is desirable that the resolutions be set so as to increase the data density of the pressure data as the pressure level shifts from the atmospheric pressure toward the preset pressure value.

It is desirable that the means for pressure adjustment be controlled so that the data value indicated by the pressure data having undergone the change in the data density is made to conform to the data value indicated by the preset pressure data.

In addition, the present invention provides a plasma processing device that is characterized in that the pressure inside the process chamber is controlled by adopting the pressure control method with the outstanding advantages described above.

BEST MODE FOR CARRYING OUT THE INVENTION

The following is a detailed explanation of a preferred embodiment achieved by adopting the pressure control method according to the present invention in a pressure control method implemented in conjunction with a plasma etching device, given in reference to the attached drawings.

(1) Structure of the Etching Device

Figure 1:
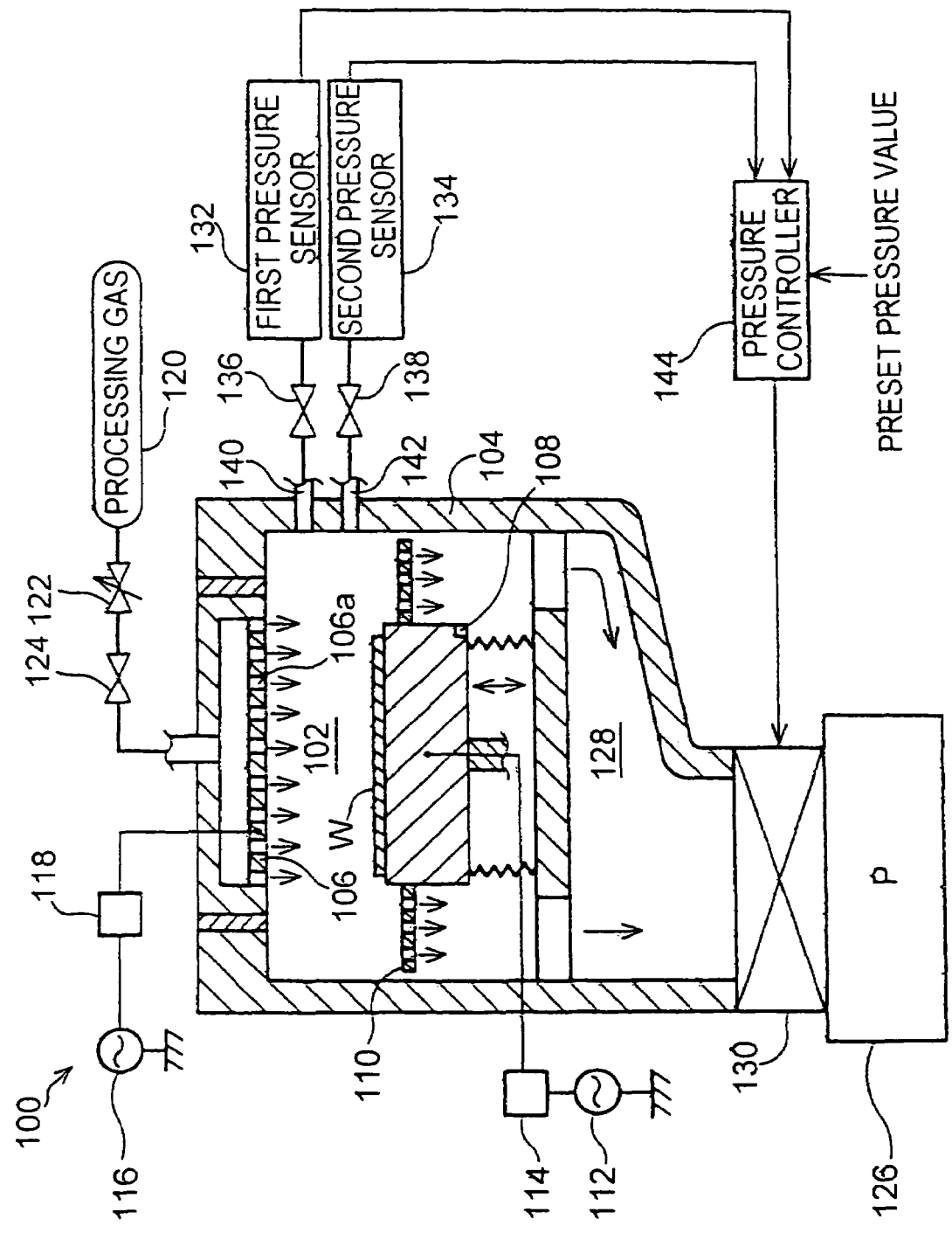
FIG. 1 is a schematic sectional view of an etching device in which the present invention may be adopted.

First, in reference to FIG. 1, the structure of an etching device 100 in which the present invention may be adopted is explained. A process chamber 102 is formed inside an electrically conductive airtight processing container 104. The processing container 104 is grounded for safety. In addition, an upper electrode 106 and a lower electrode 108 are provided facing opposite each other inside the process chamber 102. The lower electrode 108 is also utilized as a stage on which a workpiece such as a semiconductor wafer (hereafter referred to as the "wafer") W is placed. A diffusion plate 110 is provided around the lower electrode 108. A high frequency power supply 112 is connected to the lower electrode 108 via a matcher 114 to apply biasing high frequency power of, for instance, 13.56 MHz to the lower electrode 108.

In the embodiment, energy conservation is achieved by stopping the output from the high frequency power supply 112 while the process sequence is idling. In a standard high frequency power supply (linear amplifier) that is normally utilized, an idling current flows while no signal is generated to result in a collector loss in a transistor or a drain loss in a FET (field effect transistor). Energy conservation is achieved in the embodiment by turning off the biasing high frequency power to reduce the loss while the process sequence is idling.

Such energy conservation may be achieved by, for instance, providing a relay for turning on/off the power in an AC power supply line through which the power from a biasing DC source is supplied or by providing a circuit for turning on/off the drive signal for a biasing AC source. The biasing source is turned off during the period that elapses following the end of a process (after the high frequency power supply 112 is turned off and a predetermined length of time elapses) until the next unprocessed wafer is transferred into the process chamber 102 or during the period that elapses following the end of a process until the next process starts (over a predetermined period before the high frequency power supply 112 is turned on), for instance.

In addition, a high frequency power supply 116 is connected to the upper electrode 106 via a matcher 118 to apply plasma-generating high frequency power of, for instance, 60 MHz to the upper electrode 106. Numerous gas outlet holes 106a are formed at the upper electrode 106. This structure allows a processing gas provided from a gas supply source 120, such as a fluorocarbon gas, to be supplied via a flow-regulating valve 122, a switching valve 124 and the gas outlet holes 106a. The gas inside the process chamber 102 is evacuated by a vacuum pump 126 via the diffusion plate 110, an evacuating passage 128 and a pressure control valve (means for pressure adjustment) 130.

A plurality of means for pressure detection with different pressure detection ranges from one another, e.g., a first pressure sensor 132 and a second pressure sensor 134, are connected in the process chamber 102 via switching valves 136 and 138 and pressure detection holes 140 and 142 respectively. The first and second pressure sensors 132 and 134 may each be constituted of a capacitance manometer. The first pressure sensor 132 detects a pressure within a predetermined pressure range, e.g., 0 Pa~25 PaV, and outputs a voltage within a range of 0V~10V as pressure data in correspondence to the detected pressure. The second pressure sensor 134, on the other hand, detects a pressure within a wider pressure range than that of the first pressure sensor 132, e.g., 0 Pa~1000 Pa, and outputs a voltage within a range of 0V~10V as pressure data in correspondence to the detected pressure.

A pressure controller 144 is connected to the first and second pressure sensors 132 and 134. The pressure control valve 130 mentioned earlier is connected to the pressure controller 144. The pressure controller 144 controls the pressure control valve 130 based upon the pressure data provided by the first and second pressure sensors 132 and 134 and preset pressure data corresponding to a preset pressure value and sets the pressure inside the process chamber 102 to a predetermined pressure level. It is to be noted that the pressure control implemented by the pressure controller 144 is to be described in detail later. The pressure controller 144 includes various devices to be utilized in the pressure control, such as an A/D (analog-digital) converter (not shown) which converts the voltages output by the first and second pressure sensors 132 and 134 as analog data to digital data.

(2) Pressure Control Method

Next, a setting process (a) and a control process (b) implemented in the pressure control method to control the pressure inside the process chamber 102, which constitutes the core of the present invention, are individually explained.

(a) Setting Process

During the setting process (a), pressure data obtaining ranges, pressure data selection values, resolutions, resolution application ranges, resolution selection values and a control pressure value are set at the pressure controller 144.

(a-1) Setting Pressure Data Obtaining Ranges and Pressure Data Selection Values

The pressure data obtaining ranges are set to determine whether the pressure data provided by the first pressure sensor 132 or the pressure data provided by the second pressure sensor 134 are to be used in pressure control. In addition, the pressure data selection values are values (threshold values) set in correspondence to the individual pressure data obtaining ranges to be used to select the pressure data provided by either the first pressure sensor 132 or the second pressure sensor 134.

As explained earlier, the first pressure sensor 132 is capable of detecting a pressure within the 0 Pa~25 Pa range. The second pressure sensor 134 is capable of detecting a pressure within the 0 Pa~1000 Pa range. In addition, the first pressure sensor 132 achieves a higher degree of pressure detection accuracy compared to the second pressure sensor 134. For this reason, it is desirable to utilize the pressure data provided by the first pressure sensor 132 over the pressure range in which a pressure can be detected with the first pressure sensor 132. Thus, the pressure data obtaining range is set to 0 Pa~25 Pa for the first pressure sensor 132. The pressure data obtaining range is set to 25 Pa~1000 Pa for the second pressure sensor 134.

The pressure data selection values should be set to voltage values corresponding to 25 Pa so as to obtain specific pressure data from the individual pressure data obtaining ranges set for the first and second pressure sensors 132 and 134. Namely, the pressure data selection value for the first pressure sensor 132 should be set to 10V. In correspondence to the pressure level 25 Pa, whereas the pressure data selection value for the second pressure sensor 134 should be set to 0.25V in conformance to the pressure level 25 Pa. Thus, when the pressure data corresponding to the voltage value 0.25V are input from the second pressure sensor 134 as the pressure is lowered, the pressure controller 144 switches to the control implemented based upon the pressure data from the first pressure sensor 132. If, on the other hand, the pressure data corresponding to the pressure value 10V are input from the first pressure sensor 132 as the pressure is raised, the pressure controller 144 switches to the control implemented based upon the pressure data from the second pressure sensor 132*[1]. As a result, it is possible to select optimal pressure data from the pressure data provided by the first and second pressure sensors 132 and 134, in correspondence to the pressure level in the process chamber 102. Thus, it is possible to assure a level of control performance which is comparable to that achieved in pressure control implemented based upon pressure data obtained from a single pressure sensor.

(a-2) Setting Resolutions, Resolution Application Ranges and Resolution Selection Values The resolutions need to be set to virtually change the pressure detection accuracy of the first pressure sensor 132 or the second pressure sensor 134 by analyzing the pressure data provided by the first pressure sensor 132 or the second pressure sensor 134 and thus changing the data density of the pressure data. In addition, the resolution application ranges are set to determine which of the resolutions should the used within each of the varying pressure data obtaining ranges set for the first and second pressure sensors 132 and 134. The resolution selection values are values (threshold values) each set to be used to select the resolution to be adopted based upon the resolution application ranges.

In the embodiment, gate electrodes are formed by etching a polysilicon film formed on an oxide film (an SiO2 film) and a tungsten silicide film formed on the polysilicon film through continuous processing which is to be detailed later. It is desirable to process the tungsten silicide film at a low pressure of, for instance, 0.4 Pa. In addition, the polysilicon film should be processed at a pressure higher than that at which the tungsten silicide film is processed, e.g., 15 Pa. For this reason, accurate pressure control must be achieved with regard to the varying processing pressure levels. Furthermore, particularly rigorous pressure control must be achieved during the processing of the tungsten silicide film which is implemented at low pressure.

First, two varying levels of resolution, for instance, should be set to analyze the pressure data from the first pressure sensor 132. Namely, a resolution which allows pressure data to be obtained with the highest degree of accuracy, e.g., accuracy in units of 0.01 Pa, should be set in correspondence to the 0 Pa~10 Pa pressure range which contains the processing pressure level to be set for processing the tungsten suicide film. In addition, a resolution which allows pressure data to be obtained with an accuracy in units of, for instance, 0.025 Pa should be set in correspondence to the 10 Pa~25 Pa pressure range containing the processing pressure level to be set to process the polysilicon film. Accordingly, the resolution application ranges of the first pressure sensor 132 are 0 Pa~10 Pa and 10 Pa~25 Pa.

A voltage equal to or lower than 4 V is output from the first pressure sensor 132 in the 0 Pa~10 Pa range. Accordingly, the voltage 4V corresponding to 10 Pa output by the first pressure sensor 132, should be divided by, for instance, 1000. By obtaining pressure data represented by a voltage indicated in units of 4 mV through this resolution setting, it is possible to implement pressure control in units of 0.01 Pa. A voltage within a range of 4 V~10V is output from the first pressure sensor 132 in the 10 Pa~25 Pa pressure range. Accordingly, the 10V corresponding to 25 Pa output by the first pressure sensor 132 should be divided by, for instance, 1000. By obtaining pressure data constituted of a voltage indicated in units of 10 mV through this resolution setting, it is possible to implement pressure control in units of 0.025 Pa.

The voltage value 4V corresponding to 25 Pa is set as the resolution selection value for the pressure data from the first pressure sensor 132 so as to allow either of the resolutions to be used in correspondence to the resolution application range. This setting allows the pressure controller 114 to select the appropriate resolution by using the output voltage 4V from the first pressure sensor 132 as the cutoff point.

Two varying levels of resolution, for instance, should be set to analyze the pressure data from the second pressure sensor 134, as in the first pressure sensor 132. Namely, a resolution which allows pressure data to be obtained with accuracy in units of 0.01 Pa, for instance, should be set in correspondence to the 25 Pa~100 Pa pressure range. In addition, a resolution which allows pressure data to be obtained with accuracy in units of, for instance, 1 Pa should be set in correspondence to the 100 Pa~1000 Pa pressure range. Accordingly, the resolution application ranges of the second pressure sensor 134 are 25 Pa~100 Pa and 100 Pa~1000 Pa.

A voltage equal to or lower than 1V is output from the second pressure sensor 134 in the 25 Pa~100 Pa range. Accordingly, the voltage 1V corresponding to 100 Pa output by the second pressure sensor 134, should be divided by, for instance, 1000. By obtaining pressure data represented by a voltage indicated in units of 1 mV through this resolution setting, it is possible to implement pressure control in units of 0.1 Pa. A voltage within a range of 1V~10V is output from the second pressure sensor 134 in the 100 Pa~1000 Pa range. Accordingly, the 10V corresponding to 1000 Pa output by the second pressure sensor 134, should be divided by, for instance, 1000. By obtaining pressure data represented by a voltage indicated in units of 10 mV through this resolution setting, it is possible to implement pressure control in units of 1 Pa.

The voltage value 1V corresponding to 100 Pa is set for the resolution selection value for the pressure data from the second pressure sensor 134 so as to allow either of the resolutions to be used in correspondence to resolution application range. This setting allows the pressure controller 114 to select the appropriate resolution by using the output voltage 1V from the second pressure sensor 134 as the cutoff point. As a result, it becomes possible to increase the accuracy of the pressure data as the pressure level nears the processing pressure level. Thus, more rigorous pressure control is enabled during the processing, whereas fast pressure control is achieved while the processing is not in progress.

(a-3) Setting a Control Pressure Value

The control pressure value is used in the pressure control and is calculated based upon a pressure value set in units of Pa at the pressure controller 144. As explained earlier, the pressure controller 144 is capable of obtaining pressure data in units of as fine as 0.01 Pa. In addition, the pressure can be detected over a range of up to 0 Pa~1000 Pa. Accordingly, the control pressure value is set in correspondence to units of 0.01 Pa by dividing 1000 Pa by 100,000. Thus, the pressure controller 144 is enabled to implement pressure control when, for instance, a predetermined pressure value of 0.3 Pa is input, based upon a control pressure value which is calculated to be 30 in correspondence to 0.3 Pa. By adopting this method, the pressure can be set with ease in units of 0.01 Pa over the pressure detection ranges of both the first and second pressure sensors 132 and 134.

(b) Control Process

Figure 2:
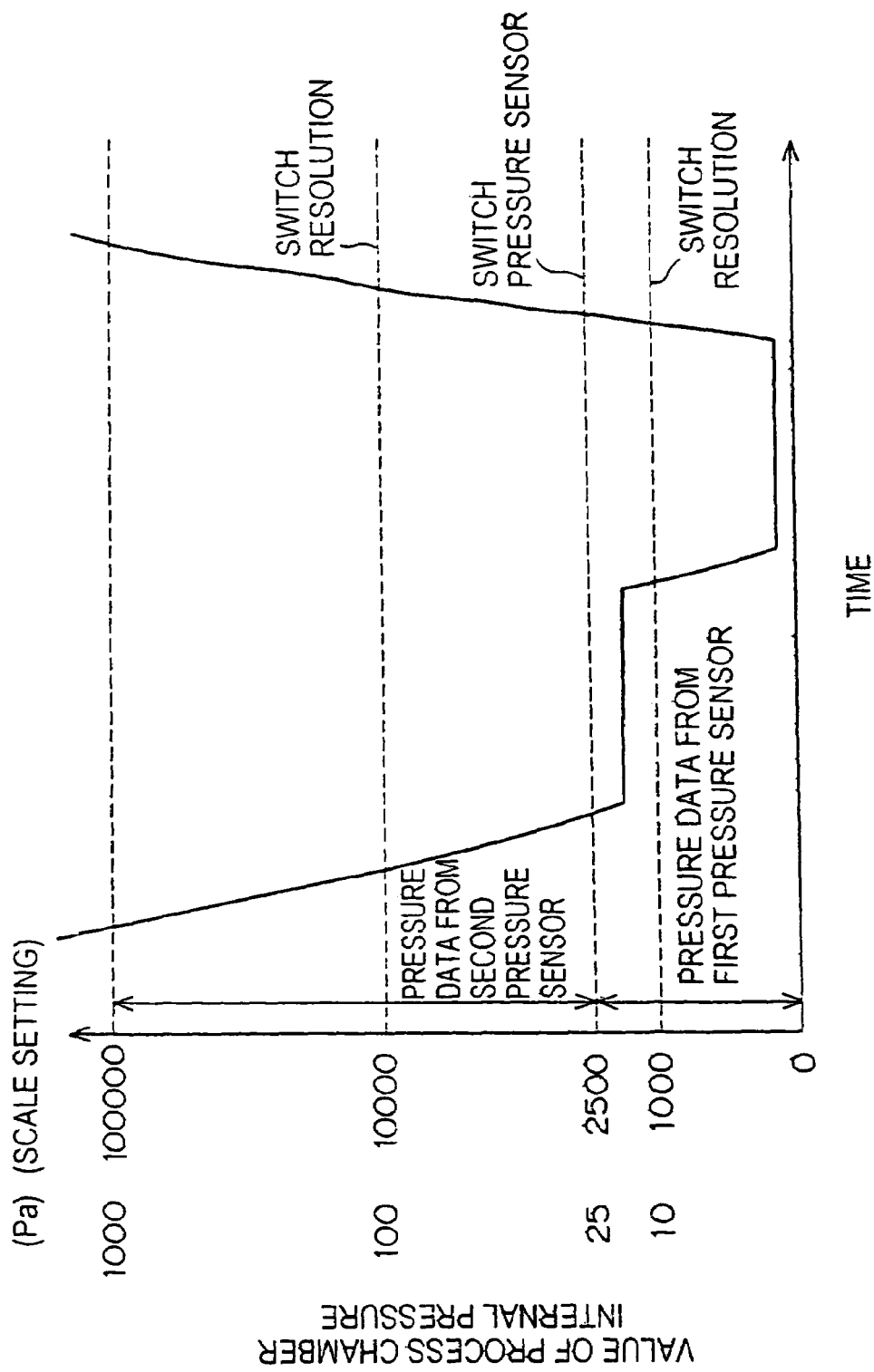
FIG. 2 schematically illustrates the pressure control structure adopted in the etching device shown in FIG. 1.

Next, in reference to FIGS. 1 and 2, the procedure of the pressure control implemented during the etching process is explained. First, prior to the etching process, the first and second pressure sensors 132 and 134 undergo an offset adjustment (0 adjustment). In addition, a pressure value of 0.4 Pa at which the polysilicon film is to be processed and a pressure value of 15 Pa at which the tungsten silicide film is to be processed are set at the pressure controller 144. The pressure controller 144 converts the preset pressure values to control pressure values as described above and uses the control pressure values resulting from the conversion in the control. After various other settings are made, the wafer W mentioned earlier is placed on the lower electrode 108. Next, the processing gas provided from the gas supply source is supplied into the process chamber 102. At the same time, the gas inside the process chamber 102 is evacuated with the vacuum pump P126. Through this evacuation, the pressure inside the process chamber 102 is lowered as shown in FIG. 2.

If the pressure inside the process chamber 102 is within a range of 100 Pa~1000 Pa, a voltage 10 V is input from the first pressure sensor 132 to the pressure controller 144 and also a voltage within a range of 1 V~10 V corresponding to the actual pressure level is input from the second pressure sensor 134 to the pressure controller 144. The pressure controller 144 judges that the value of the voltage input from the second pressure sensor 134 is larger than the pressure data selection value 0.25 V corresponding to 25 Pa and thus selects of the pressure data provided by the second pressure sensor 134. In addition, the pressure controller 144 judges that the value of the voltage input from the second pressure sensor 134 is larger than the resolution selection value 1 V corresponding to 100 Pa and accordingly analyzes the pressure data from the second pressure sensor 134 with the resolution that provides a pressure value indicated in units of 1 Pa. Thus, the pressure controller 144 is enabled to control the pressure control valve 130 based upon the pressure data provided in units of 1 Pa.

If the pressure inside the process chamber 102 is lowered to a level in the 25 Pa~100 Pa range, a voltage within a range of 0.25 V~1 V is input from the second pressure sensor 134 to the pressure controller 144. The pressure controller 144 judges that the value of the voltage input from the second pressure sensor 134 is equal to or smaller than the resolution selection value 1 V and accordingly switches the resolution so as to control the pressure control valve 130 based upon the pressure data provided in units of 0.1 Pa.

If the pressure inside the process chamber 102 is further reduced to a level lower than 25 Pa, a voltage lower than 10 V and a voltage lower than 0.25 V are input respectively from the first pressure sensor 132 and the second pressure sensor 134 to the pressure controller 144. The pressure controller 144 judges that the value of the voltage input from the second pressure sensor 134 is smaller than the pressure data selection value 0.25 V and thus selects the pressure data provided by the first pressure sensor 132. In addition, the pressure controller 144 judges that the value of the voltage input from the first pressure sensor 132 is larger than the resolution selection value 4 V corresponding to 10 Pa and accordingly analyzes the pressure data from the first pressure sensor 132 with the resolution which provides a pressure value in units of 0.025 Pa.

As the pressure inside the process chamber 102 reaches 15 Pa, the level set for etching the tungsten silicide film, the pressure controller 144 controls the pressure control valve 130 so as to sustain this pressure level. When the pressure is stabilized at the 15 Pa level, the high frequency power of 60 MHz mentioned earlier is applied to the upper electrode 106 to convert the processing gas to plasma. In addition, the high frequency power of 13.56 MHz mentioned earlier is applied to the lower electrode 108 to induce plasma to the wafer W. Thus, the tungsten silicide film is etched and gate electrodes are formed.

Once the specific etching process is implemented on the tungsten silicide film, the polysilicon film is etched. Immediately before the polysilicon film becomes exposed, the pressure controller 144 lowers the pressure inside the process chamber 102 to the 0.4 Pa level at which the polysilicon film is to be processed by controlling the pressure control valve 130. When the pressure inside the process chamber 102 becomes equal to or lower than 10 Pa, a voltage equal to or lower than 4 V is input from the first pressure sensor 132 to the pressure controller 144. The pressure controller 144 judges that the value of the voltage input from the first pressure sensor 132 is equal to or lower than the resolution selection value 4 V and accordingly switches the resolution to control the pressure control valve 130 based upon the pressure data provided in units of 0.01 Pa. In addition, as the pressure inside the process chamber 102 reaches the 0.4 Pa level, the pressure controller 144 implements control on the pressure control valve 130 so as to sustain this pressure level. Through this pressure control, gate electrodes achieving a specific shape are formed at the polysilicon film as well. It is to be noted that the frequencies of the high frequency power applied to the upper electrode 106 and the lower electrode 108 and the type of processing gas supplied into the process chamber 102 while etching the polysilicon film may be varied as necessary.

While the invention has been particularly shown and described with respect to the embodiment thereof by referring to the attached drawings, the present invention is not limited to this example and it will be understood by those skilled in the art that various changes in form and detail may be made therein without departing from the spirit, scope and teaching of the invention.

For instance, while an explanation is given in reference to the embodiment on an example in which the pressure inside the process chamber is detected by using two pressure sensors, the present invention is not limited to this example. The present invention may also be adopted in control achieved by detecting the pressure with a single means for pressure detection or with three or more means for pressure detection as well.

In addition, while the present invention is explained in reference to the embodiment in which the pressure data from the first and second pressure sensors are analyzed with two different resolutions, the present invention is not limited by this example. The present invention may instead be adopted in control achieved by analyzing pressure data from a pressure sensor with three or more different resolutions in correspondence to the varying pressure settings.

While an explanation is given in reference to the embodiment on an example in which the pressure inside the process chamber of a plane-parallel plasma etching device is controlled, the present invention is not limited to this example. The present invention may also be adopted in pressure control implemented to control the pressure inside the process chamber of any of various types of plasma processing device including inductively coupled plasma processing devices and microwave plasma processing devices.

According to the present invention, even when the pressure inside the process chamber is detected by employing a plurality of means for pressure detection, appropriate pressure data can be quickly selected from the pressure data provided by the individual means for pressure detection to be used in the pressure control. Thus, a high degree of control performance comparable to that achieved in control implemented based upon pressure data from a single means for pressure detection is assured even though the pressure is detected by the plurality of means for pressure detection. In addition, the pressure detection accuracy of the means for pressure detection can be improved virtually. As a result, the pressure inside the process chamber can be controlled with a high degree of accuracy. Furthermore, according to the present invention, the pressure data used the pressure control can be obtained through software processing. Consequently, even when the pressure inside the process chamber changes drastically, the pressure inside the process chamber can be detected almost concurrently as the pressure change occurs. Thus, pressure control which is implemented in conformance to any pressure change is achieved.

INDUSTRIAL APPLICABILITY

The present invention may be adopted when implementing processing that requires pressure control in a semiconductor device manufacturing process and in particular, it may be adopted in super-miniaturization processing implemented on a workpiece during which the pressure inside the process chamber needs to be sustained at a predetermined level through rigorous control.

What is claimed is:

1. A pressure controller for use in controlling pressure inside a process chamber based on pressure data obtained from a plurality of pressure sensors, the pressure sensors each connected to the process chamber and configured to detect the pressure inside the process chamber, the pressure controller being configured to execute:
    setting a pressure detection range for each of the pressure sensors, the pressure detection range for each of the pressure sensors being different from one another, at least two of the pressure detection ranges having an overlapping range;
    setting a selection value for each of the pressure sensors, wherein the selection value is used for selecting the pressure sensor to be used to obtain the pressure data for use in controlling the pressure inside the process chamber;
    selecting the pressure data to be used in controlling the pressure inside the process chamber by comparing the pressure data obtained from each of the pressure sensors to the corresponding selection value in each of the pressure sensors; and
    adjusting the pressure inside the process chamber based on the selected pressure data and preset pressure data.

2. A pressure controller according to claim 1, wherein selecting the pressure data comprises selecting the pressure data obtained from one of the pressure sensors, the selected pressure data having a higher degree of detection accuracy than other pressure data obtained from one or more other pressure sensors.

3. A pressure controller according to claim 1, wherein adjusting the pressure inside the process chamber comprises matching the pressure inside the process chamber to a preset pressure by comparing the selected pressure data with the preset pressure data.

4. A pressure controller according to claim 3, wherein the pressure controller adjusts a pressure control valve to match the pressure inside the process chamber to the preset pressure.

5. A pressure controller according to claim 3, wherein the process chamber is used to manufacture a semiconductor device.

6. A pressure controller for use in controlling pressure inside a process chamber based on pressure data obtained from a plurality of pressure sensors, the pressure sensors being configured to detect the pressure inside the process chamber and generate pressure data, the pressure controller being configured to execute:
    setting at least two resolutions for each of the pressure sensors having a pressure detection range, each of the resolutions having a resolution application range;
    setting a resolution selection value to be used to select a single resolution from the at least two resolutions based on the individual resolution application ranges;
    selecting one resolution from the at least two resolutions by comparing the pressure data with the resolution selection value;
    virtually changing the data density of the pressure data at the selected resolution; and
    adjusting the pressure inside the process chamber based on the pressure data having the data density changed at the selected resolution and preset pressure data corresponding to a preset pressure.

7. A pressure controller according to claim 6, wherein the resolutions are set so as to increase the data density of the pressure data within a specific pressure range containing the preset pressure.

8. A pressure controller according to claim 6, wherein the resolutions are set so as to increase the data density of the pressure data as the pressure inside the process chamber shifts from an atmospheric pressure toward the preset pressure.

9. A pressure controller according to claim 6, wherein adjusting the pressure inside the process chamber comprises matching the pressure data having the data density changed at the selected resolution with the preset pressure data.

10. A pressure controller for use in controlling pressure inside a process chamber based on pressure data obtained from a plurality of pressure sensors, the pressure sensors being configured to detect the pressure inside the process chamber and generate pressure data, the pressure controller being configured to execute:
    setting a pressure detection range for each of the pressure sensors, the pressure detection ranges of the pressure sensors being different from one another, at least two of the pressure detection ranges having an overlapping range;
    setting a selection value for each of the pressure sensors, wherein the selection value is used for selecting the pressure sensor to be used to obtain the pressure data for use in controlling the pressure inside the process chamber;
    setting at least two resolutions for each pressure detection range of the pressure sensors, each of the resolutions having a resolution application;
    setting a resolution selection value to be used to select a single resolution from the at least two resolutions based on the individual resolution application ranges;
    selecting the pressure data to be used in controlling the pressure inside the process chamber by comparing the pressure data obtained from each of the pressure sensors to the corresponding selection value in each of the pressure sensors; and
    selecting one resolution from the at least two resolutions by comparing the pressure data with the resolution selection value;

virtually changing the data density of the pressure data at the selected resolution and adjusting the pressure inside the process chamber based on the pressure data having the data density changed at the selected resolution and preset pressure data corresponding to a preset pressure.

11. A pressure controller according to claim 10, wherein selecting the pressure data comprises selecting the pressure data obtained from one of the pressure sensors, the selected pressure data having a higher degree of detection accuracy than other pressure data obtained from one or more other pressure sensors.

12. A pressure controller according to claim 10, wherein the resolutions are set so as to increase the data density of the pressure data within a specific pressure range containing the preset pressure.

13. A pressure controller according to claim 10, wherein the resolutions are set so as to increase the data density of the pressure data as the pressure inside the process chamber shifts from an atmospheric pressure toward the preset pressure.

14. A pressure controller according to claim 10, wherein adjusting the pressure inside the process chamber comprises matching the pressure data having the data density changed at the selected resolution with the preset pressure data.

* * * * *